United States Patent
Huang et al.

(10) Patent No.: US 6,774,488 B2
(45) Date of Patent: Aug. 10, 2004

(54) LOW LEAKAGE AND LOW RESISTANCE FOR MEMORY AND THE MANUFACTURING METHOD FOR THE PLUGS

(75) Inventors: Wen-Kuei Huang, Hsinchu (TW); Hsi-Chuan Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/012,925

(22) Filed: Oct. 22, 2001

(65) Prior Publication Data

US 2003/0077900 A1 Apr. 24, 2003

(51) Int. Cl.$^7$ ............................................... H01L 23/52
(52) U.S. Cl. ..................... 257/751; 257/754; 257/774; 438/629
(58) Field of Search ................................ 257/751–752, 257/754, 763, 774, 298, 770; 438/629

(56) References Cited

U.S. PATENT DOCUMENTS

| | | | | | |
|---|---|---|---|---|---|
| 4,801,559 | A | * | 1/1989 | Imaoka | 438/629 |
| 5,670,425 | A | * | 9/1997 | Schinella et al. | 438/645 |
| 6,028,000 | A | * | 2/2000 | Cho | 438/638 |
| 6,294,422 | B1 | * | 9/2001 | Sunouchi et al. | 438/241 |
| 6,444,520 | B1 | * | 9/2002 | Dennison et al. | 438/253 |

* cited by examiner

Primary Examiner—Richard A. Booth
(74) Attorney, Agent, or Firm—Jackson Walker LLP

(57) ABSTRACT

Low leakage and low resistance plugs for a memory device and the manufacturing method for the plugs includes a doped polysilicon layer first deposited at contact nodes and bit-line contacts inside the memory to form a low leakage interface. A low contact resistance imbedded tungsten plug is subsequently deposited on the polysilicon layer to form a low contact resistance imbedded tungsten plug in concavities at the contact nodes and bit-line contacts. Excess material is etched to leave double layer plugs at the contact nodes and bit-line contacts that constitute low leakage and low contact resistance memory plugs.

2 Claims, 3 Drawing Sheets

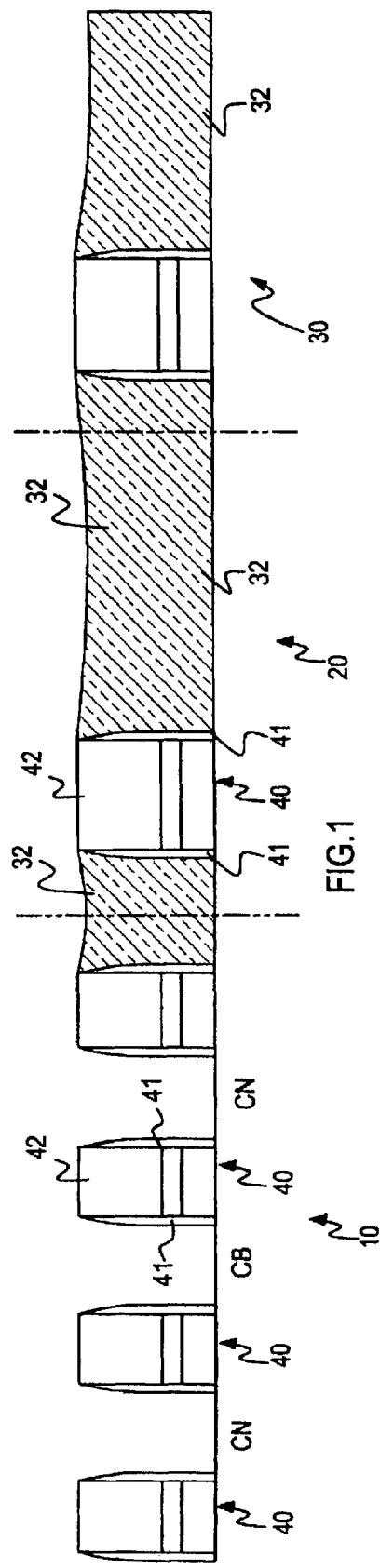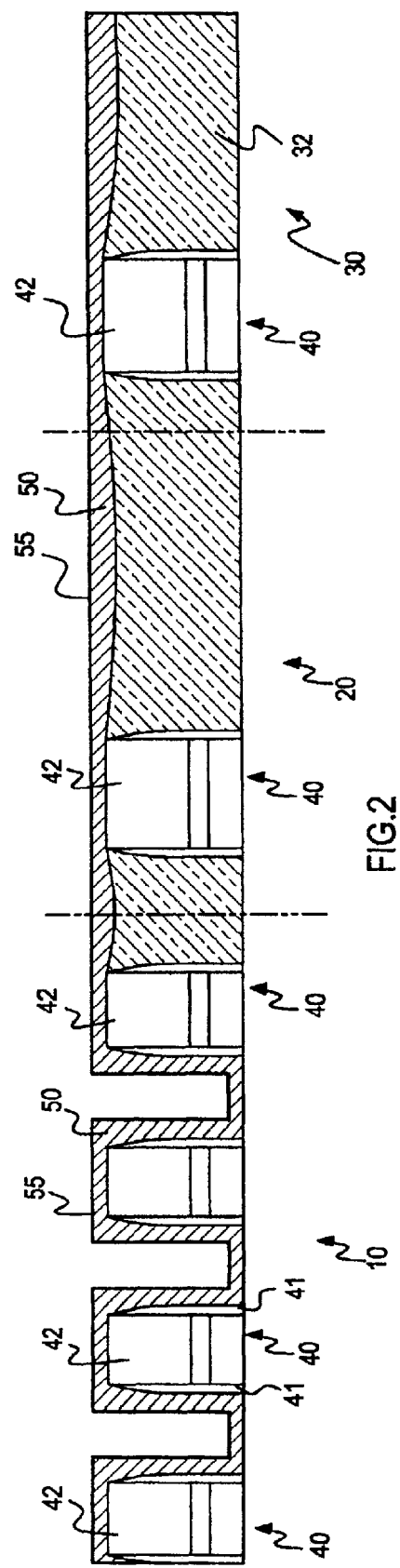
FIG.1
FIG.2

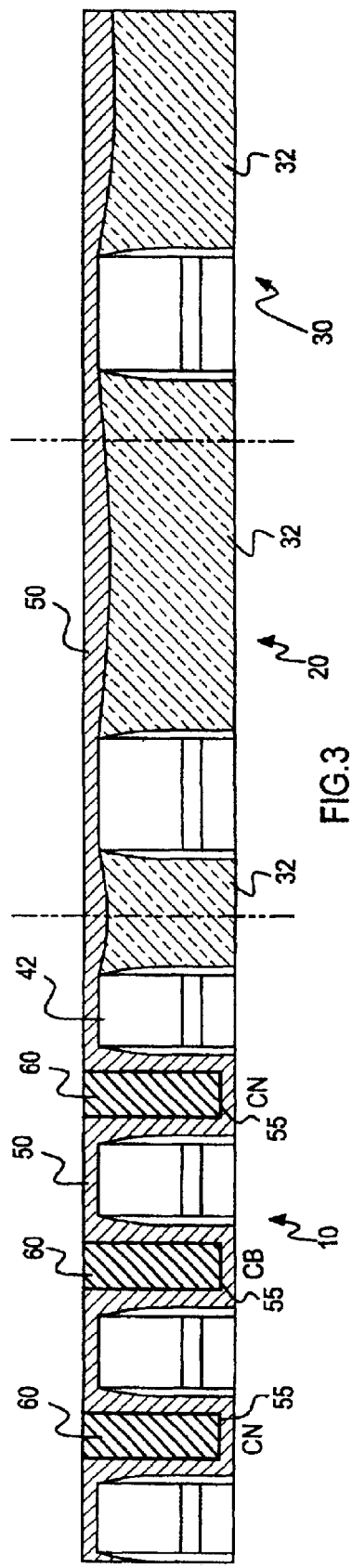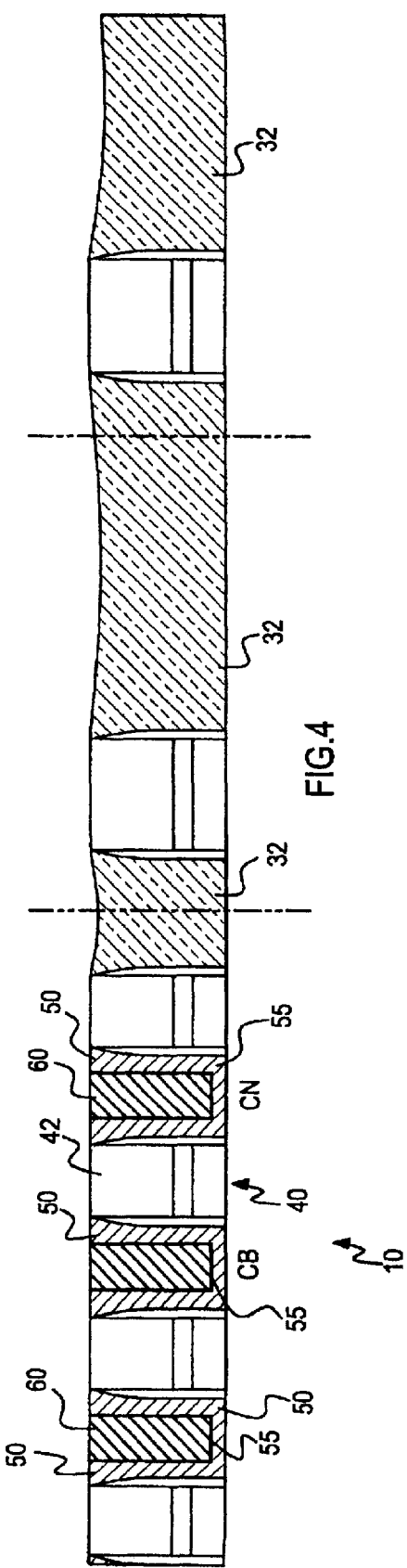

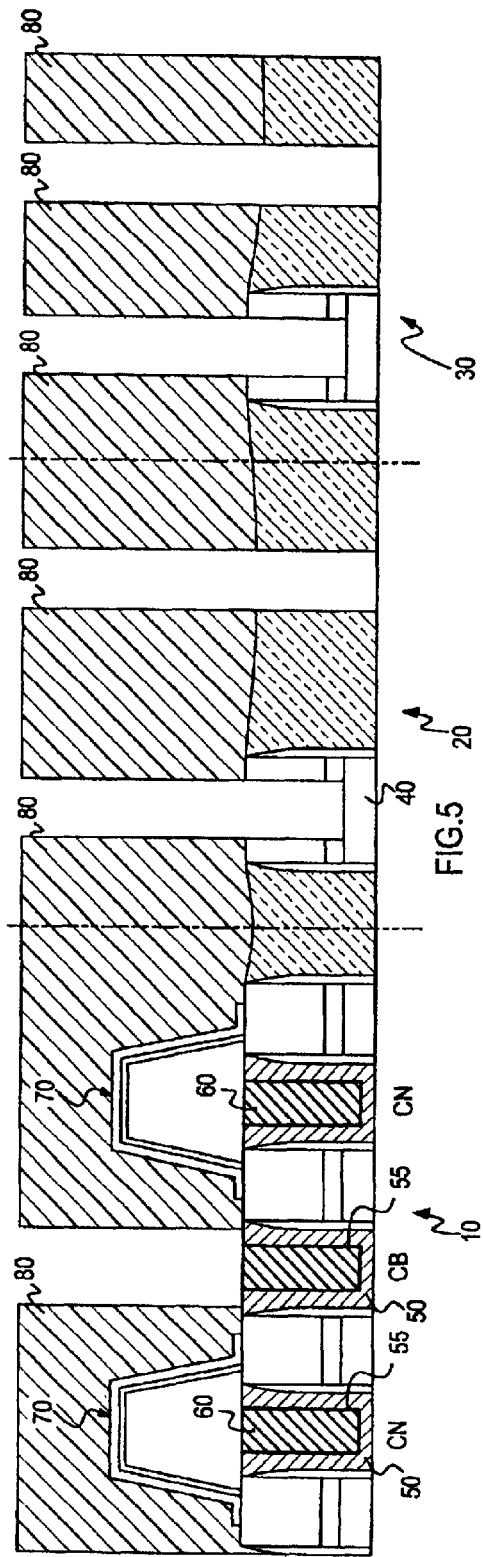
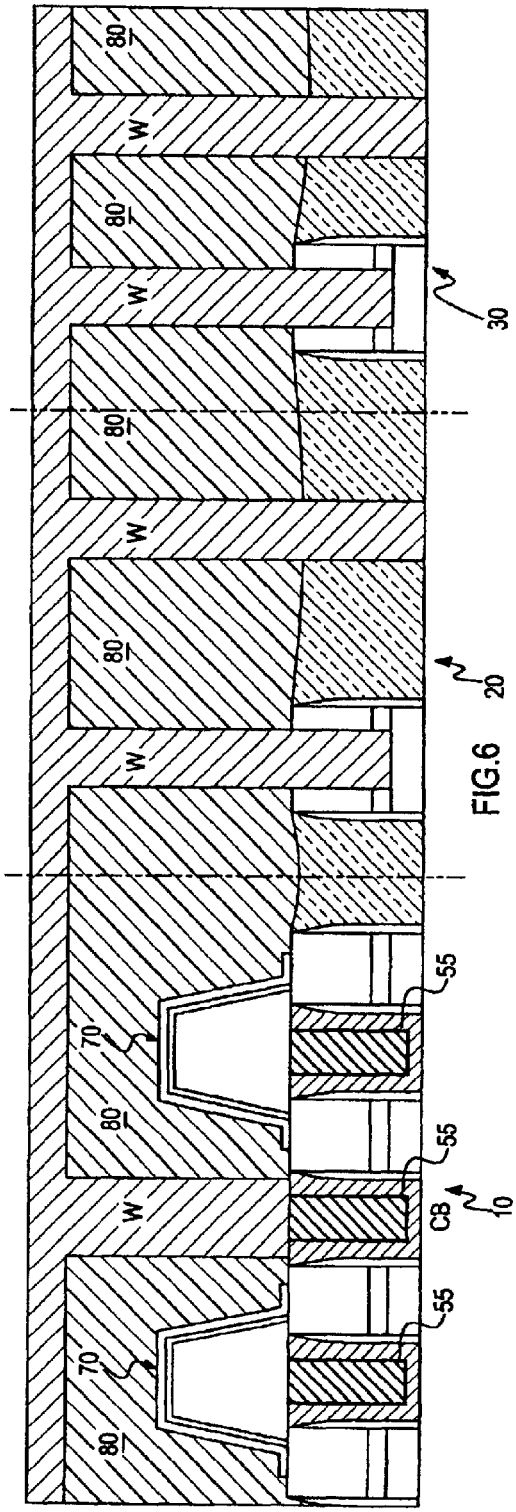

LOW LEAKAGE AND LOW RESISTANCE FOR MEMORY AND THE MANUFACTURING METHOD FOR THE PLUGS

BACKGROUND OF THE INVENTION

1. Field of Invention

The invention relates to low leakage and low resistance plugs, specifically low leakage and low resistance plugs for a memory device and the manufacturing method for the plugs. In particular, a doped polysilicon layer is first deposited at contact nodes and bit-line contacts inside memory to form a low leakage interface, followed by depositing a low contact resistance imbedded tungsten plug in the polysilicon layer to form a low contact resistance imbedded tungsten plug.

2. Related Art

Embedded DRAM is one example of a product that integrates the memory circuit and the logic circuit in one manufacturing process. However, when integrating two circuits with different functions in a single manufacturing process, the following problem arises. For the memory circuit, the memory cell and the linking current of the capacitor have to be limited to their minima so that the memory will have a longer retention time. The memory circuit uses a doped polysilicon plug as the conducting loop for the cell contact and bit-line contact. Although the doped polysilicon plug provides low leakage interface, it has a high contact resistance Rc. On the other hand, the logic circuit of the embedded DRAM has to have a higher driving current to have a faster reaction speed. Therefore, the internal conducting loop is formed using tungsten plugs to satisfy the low contact resistance and high speed characteristics. Nevertheless, the linking current becomes serious.

For the foregoing reasons, a polysilicon plug and tungsten plug are usually formed individually in memory circuit and logic circuit areas with separate procedures during the manufacturing process of the memory to satisfy the properties of the memory circuit and logic circuit. Using this method can result in low leakage and low contact resistance and temporarily solve the problem of integrating them in the same manufacturing process. Thus, the experts in the field are pursuing how to effectively utilize the above polysilicon plug and tungsten plug procedures.

SUMMARY OF THE INVENTION

An objective of the invention is to provide low leakage and low resistance plugs for a memory device and the method for manufacturing the plugs. According to the invention, a low leakage imbedded polysilicon layer is formed on a memory cell inside the memory. Then low contact resistance tungsten contact plugs are deposited in the imbedded polysilicon layer. Using the double layer plug structure, the conducting loop of the memory cell not only has low leakage but also achieves unprecedented low contact resistance over conventional manufacturing processes, thus increasing the speed of the memory device.

Another objective of the invention is to provide low leakage and low resistance plugs for a memory device and the manufacturing method of the plugs, wherein the polysilicon and tungsten inside the memory cell form double layer plugs by deposition and stacking without performing such steps as forming photo resist, mask development, removing photo resist, etc. Thus, the invention can simplify manufacturing memory.

To achieve the foregoing objectives, the method in accordance with the present invention includes the steps of forming a polysilicon layer, forming imbedded tungsten plugs and chemical machine polishing (CMP).

In the forming a polysilicon layer step, a polysilicon layer is deposited on a silicon substrate with multiple transistors formed on the substrate, so that the contact nodes and the bit-line contacts are covered by the polysilicon layer.

In the forming imbedded tungsten plugs step, the imbedded tungsten plugs are formed at the contact nodes (CNs) and bit-line contacts (CBs) above the polysilicon layer by depositing.

In the chemical machine polishing step, the height of the imbedded tungsten plugs are polished to the top of each contact node and bit-line contact.

Through the foregoing steps, a double layer material with a low leakage polysilicon layer and low contact resistance tungsten plugs form the contact nodes and bit-line contacts inside the memory.

BRIEF DESCRIPTION OF THE DRAWINGS

FIG. 1 is a cross-sectional side plan view of the memory device;

FIG. 2 is a cross-sectional side plan view of a memory cell formed with a polysilicon layer;

FIG. 3 is a cross-sectional side plan view of the memory cell with tungsten plugs formed at contact nodes and bit-line contacts;

FIG. 4 is a cross-sectional side plan view of the memory device after etching the tungsten plugs on the contact nodes and bit-line contacts and the polysilicon layer;

FIG. 5 is a cross-sectional side plan view of the memory cell with capacitors further connecting the tungsten plugs; and FIG. 6 is a cross-sectional side plan view of the memory cell with tungsten plugs connecting with logic circuit nodes.

DETAILED DESCRIPTION OF THE INVENTION

The main objective of the invention is to form a double layer plug with a polysilicon layer and imbedded tungsten plug on a memory cell inside a memory device so that the memory cell has low leakage and low contact resistance and the memory speed can be increased. Therefore, all the procedures for preparing the memory cell, such as forming capacitors, interconnection and passivation are conventional and are excluded from the description.

With reference to FIG. 1, a DRAM memory cell area 10, a DRAM peripheral area 20 and a logic circuit area 30 are first formed on a silicon substrate. The transistors inside each of the areas are formed on the substrate in procedures prerequisite to the method in accordance with the present invention. The protruding gates 40 of the transistors have a multiple layer structure. The outermost layer is silicon nitride (SiN) 42. Spacers 41 are formed around the gates 40 for self-alignment.

Borophosphosilicate glass (BPSG) 32 covers the whole area to provide a protective layer. Through a reflow procedure, the BPSG 32 becomes more solid. Finally, the CMP (Chemical Machine Polishing) method is utilized to polish the BPSG 32 to as high as the gates 40. Afterwards, a mask covers the memory peripheral area 20 and the logic circuit area 30. The exposed memory cell area 10 is then back etched to remove the BPSG 32 to form the contacts.

Therefore, contact nodes (CN's) and bit-line contacts (CB's) are formed in the memory cell area 10 below the surface of the silicon substrate. The memory peripheral area 20 and the logic circuit 30 are still preserved with a protective layer of BPSG 32. After carrying out the foregoing procedure, the procedure to form a double layer plug in accordance with the present invention is carried out. The description of the procedure follows.

With reference to FIG. 2, the procedure to form the double layer plug in accordance with the present invention first begins with the step of forming a polysilicon layer. The polysilicon layer 50 is a thin film covering formed by deposition. The thin film layer is also doped with phosphor, arsenic or another amorphous element to form a doped polysilicon layer 50. The polysilicon layer 50 provides low leakage junctions for the CN's and CB's.

Next, the step of forming a barrier layer forms a barrier layer 55 on the polysilicon layer 50. The barrier layer 55 material can be titanium (Ti) or titanium nitride (TiN), which provides the link between the lower polysilicon layer 50 and the upper layer materials and prevents mixture.

The step of forming imbedded tungsten plugs forms imbedded tungsten plugs 60 over the all places to fill all contacts by CVD (Chemical Vapor Deposition).

The step of CMP then polishes the top of each imbedded tungsten plug 60 until the polysilicon layer 50 is exposed. With reference to FIG. 3, the polysilicon layer 50 and the imbedded tungsten plugs 60 remain only in the areas of the CN's and CB's.

With reference to FIG. 4, the etching step finally etches both the imbedded tungsten plugs 60 and the polysilicon layer 50 down to the level of the silicon nitride 42 on the top of the gates 40 since the etching rates of the imbedded tungsten plugs 60 and the polysilicon layer 50 are almost equal.

After the etching is complete, the double layer structure composed of a polysilicon layer 50 and imbedded tungsten plugs 60 is formed on the CN's and the CB's. Subsequent procedures are conventional and are not described.

With reference to FIG. 5, a stack capacitor 70 is further formed above the imbedded tungsten plug 60 inside the CN. The stack capacitor 70 is connected to the CN through the imbedded tungsten plug 60 and the polysilicon layer 50. A tetraethyl orthosilicate (TEOS) layer 80 is formed and defined to cover the top of the capacitor 70, the memory peripheral area 20 and the logic circuit area 30.

With reference to FIG. 6, tungsten (W) is deposited on the memory cell area 10, the memory peripheral area 20 and the logic circuit area 30 to form tungsten plugs (not numbered) and conducting loops (not shown). A passivation layer is applied to the exterior of the fabricated memory that is packaged finish the process.

The invention may be varied in many ways by a skilled person in the art. Such variations are not to be regarded as a departure from the spirit and scope of the invention, and all such modifications are intended to be included within the scope of the following claims.

What is claimed is:

1. A memory device with low leakage and low contact resistance plugs, comprising:

a silicon substrate;

multiple transistors formed on the silicon substrate, a gate of each of the transistors protruding out of the silicon substrate, having a multiple layer structure, and being surrounded by a spacer layer, with concave contacts being formed between adjacent gates, wherein each concave contact has two opposite sidewalls and a bottom where a joint is defined between the concave contact and the silicon substrate; and multiple double layer plugs each of which has a height, is filled with one of the concave contact and is composed of an outer polysilicon layer, a middle barrier layer and an inner tungsten layer, wherein the outer polysilicon layer is formed on the two opposite side walls and the bottom to form a polysilicon concave notch having inner sides with a thin film formed on each inner side as the middle barrier layer, and then the polysilicon concave notch is filled with the inner tungsten layer; wherein the height of each double layer plug is equal to that of the transistor gate.

2. The device of claim 1, wherein each outer polysilicon layer is doped polysilicon.

* * * * *